United States Patent

Tagiri et al.

Patent Number: 6,057,678
Date of Patent: May 2, 2000

[54] OPTICAL SENSOR APPARATUS AND SIGNAL PROCESSING CIRCUIT USED THEREIN INCLUDING INITIALIZATION AND MEASURING MODES

[75] Inventors: Satoshi Tagiri, Neyagawa; Daisuke Ishiko, Hirakata, both of Japan

[73] Assignee: Matsushita Electric Industrial Co., Ltd., Osaka-fu, Japan

[21] Appl. No.: 09/198,517

[22] Filed: Nov. 24, 1998

[30] Foreign Application Priority Data

Nov. 28, 1997 [JP] Japan ................................. 9-327879

[51] Int. Cl.[7] .................. G01R 19/00; G01R 33/032; G01R 17/02
[52] U.S. Cl. .................. 324/96; 324/244.1; 250/227.14
[58] Field of Search .................. 324/96, 244.1; 250/227.14, 231.1; 356/364, 365

[56] References Cited

U.S. PATENT DOCUMENTS

| | | | |
|---|---|---|---|
| 4,540,937 | 9/1985 | Asars | 324/96 |
| 4,694,243 | 9/1987 | Miller et al. | 324/96 |
| 5,747,793 | 5/1998 | Sunderg et al. | 250/227.14 |
| 5,963,034 | 10/1999 | Mahapatra et al. | 324/244.1 |

FOREIGN PATENT DOCUMENTS 62-150170  7/1987  Japan.

*Primary Examiner*—Gerard Strecker
*Attorney, Agent, or Firm*—Wenderoth, Lind & Ponack, L.L.P.

[57] ABSTRACT

An optical sensor apparatus capable of accurate measurement without using a filter circuit, and therefore being further capable of pulse driving an LED and thus reducing power consumption, is provided. To achieve such an optical sensor apparatus, when an optical current sensor 10 is not sensing the current to be measured, an optical current sensor signal processing circuit 11 first supplies dc light of a specific intensity to the optical current sensor 10, and then adjusts the intensity of the light so that the intensity of light returned from the optical current sensor 10 to the signal processing circuit 11 is a specific predetermined value. When the optical current sensor 10 is sensing the current, the signal processing circuit 11 electrically processes the optical signal from the optical current sensor 10 to measure the current.

7 Claims, 4 Drawing Sheets

OPTICAL SENSOR APPARATUS AND SIGNAL PROCESSING CIRCUIT USED THEREIN INCLUDING INITIALIZATION AND MEASURING MODES

BACKGROUND OF THE INVENTION

1. Field of the Invention

The present invention relates to an optical sensor apparatus, and relates more specifically to an intensity-modulated optical sensor apparatus (hereinafter simply "optical sensor") for measuring such physical quantities as current and voltage based on intensity modulation of light. The present invention further relates to a signal processing circuit used in the aforementioned optical sensor apparatus.

2. Description of the Background Art

An optical sensor can be used for measuring current, voltage, and other physical properties based on intensity modulation of light using, for example, the Faraday effect or Pockels effect. Equipment typical of such optical sensors is taught in Japanese Unexamined Patent Publication (kokai) S62-150170 (1987-150170). Such optical sensors are commonly used in the power generating industry, particularly as current-voltage measurement equipment and fault detection equipment on power transmission lines, because of their high withstand voltage and high insulation properties. Application in general purpose measuring instruments has also been considered with the development of high performance, low cost optical sensors, but this requires the development of specialized optical sensor signal processing circuits.

FIG. 3 is a block diagram of an exemplary optical current sensor apparatus according to the related art. As shown in FIG. 3, this optical current sensor apparatus comprises an optical current sensor 30 and an optical current sensor signal processing circuit (hereinafter referred to as signal processing circuit) 31 connected by means of optical fibers 33 and optical connectors 32. The signal processing circuit 31 comprises an optical-electrical conversion circuit 311, subtraction circuit 312, filter 313, LED driver 314, and LED 315.

The optical current sensor 30 contains a magneto-optical crystal (not shown in the figure), detects a change in (the field strength of) the current to be measured, and intensity modulates light according to the detection result. The signal processing circuit 31 supplies a dc light beam to the optical current sensor 30, and calculates a current value based on the modulated optical signal returned by the optical current sensor 30. It should be noted that "dc light" as used herein refers to an output light beam obtained by driving the LED 315 with a dc current.

The relationship between the intensity P0 of light outputted from the signal processing circuit 31 to the optical current sensor 30, and the intensity P of the optical signal returned from the optical current sensor 30 to the signal processing circuit 31, can be derived from the following equation (1):

$$P = \alpha P0(1 + m^*\sin\omega t) \quad (1)$$

where m is the intensity modulation factor of optical current sensor 30 for an ac current signal $I\sin\omega t$, and $\alpha$ is a coefficient corresponding to the optical transmission loss of, for example, the optical current sensor 30, optical connectors 32, and optical fibers 33.

The signal processing circuit 31 obtains current value $I\sin\omega t$ ($m^*\sin\omega t$) by extracting only the ($m^*\sin\omega t$) component from the intensity P derived from equation (1).

The optical-electrical conversion circuit 311 of the signal processing circuit 31 converts the optical signal from the optical current sensor 30 to an electrical signal. The subtraction circuit 312 then subtracts a specified value (K) from the converted electrical signal by the optical-electrical conversion circuit 311. The filter 313 extracts the dc component (V$\alpha$) from the converted electrical signal by the optical-electrical conversion circuit 311. The LED driver 314 controls the drive current used for driving the LED 315. The LED 315 then outputs the light beam supplied to the optical current sensor 30 according to the applied drive current.

The basic operation whereby the optical current sensor apparatus shown in FIG. 3 measures current is described next below.

When a predetermined initial drive current is applied in the signal processing circuit 31, the LED 315 emits a light beam. The light beam thus outputted from the signal processing circuit 31 is inputted through the optical fibers 33 to the optical current sensor 30, intensity modulated therein, and then returned again through the optical fibers 33 to the signal processing circuit 31. The optical-electrical conversion circuit 311 of the signal processing circuit 31 then converts the returned light intensity P to a current value V, and the subtraction circuit 312 further subtracts value K, equivalent to the dc component, from the current value V obtained by conversion to extract ($m^*\sin\omega t$).

It should be noted that in the basic operation described above the value V$\alpha$ of the dc component contained in the current value V is not identical to the value K subtracted by the subtraction circuit 312 to account for the optical transmission loss of, for example, the optical current sensor 30, optical connectors 32, and optical fibers 33. This value V$\alpha$ also changes with, for example, aging of these and other components. As a result, an accurate current value $I\sin\omega t$ ($m^*\sin\omega t$) cannot be obtained by this simple subtraction operation. The optical current sensor apparatus shown in FIG. 3 therefore comprises a filter 313 to extract the dc component V$\alpha$ from the current value V obtained by conversion by the optical-electrical conversion circuit 311, and the LED driver 314 adjusts the LED 315 drive current so that the extracted dc component V$\alpha$ consistently matches a constant K.

The above-described method of adjusting the drive current is known as auto power control (APC). By applying APC, the input-output relationship of the signal processing circuit 31 shown in equation (1) can be restated using equation (2):

$$P = k(1 + m^*\sin\omega t) \quad (2)$$

where k is a constant.

The current value V obtained by converting the intensity P derived from equation (2) by the optical-electrical conversion circuit 311 can therefore be derived from equation (3):

$$V = K(1 + m^*\sin\omega t) \quad (3)$$

where K is a constant.

The current value V derived from equation (3) is then inputted to the subtraction circuit 312 where constant K is subtracted from V. As a result, the output Vout of the subtraction circuit 312 can be derived from equation (4).

$$V\text{out} = V - K = K^*m^*\sin\omega t ( m^*\sin\omega t) \quad (4)$$

The optical current sensor apparatus shown in FIG. 3 can thus obtain the current value $I\sin\omega t$ ($m^*\sin\omega t$) from the output passed by the subtraction circuit 312.

FIG. 4 is a block diagram of an exemplary optical current sensor apparatus according to another version of the related art. As shown in FIG. 4, this optical current sensor apparatus comprises an optical current sensor 40 and an optical current sensor signal processing circuit (hereinafter referred to as signal processing circuit) 41, which are connected by means of optical fibers 43 and optical connectors 42.

The signal processing circuit 41 comprises an optical-electrical conversion circuit 411, filter 412, subtraction circuit 413, divider circuit 414, LED driver 415, and LED 416.

The optical current sensor 40 contains a magneto-optical crystal (not shown in the figure), detects a change in (the field strength of) the current to be measured, and intensity modulates light according to the detection result. The signal processing circuit 41 supplies light to the optical current sensor 40, and calculates a current value based on the modulated optical signal returned by the optical current sensor 40.

The relationship between the intensity P0 of light outputted from the signal processing circuit 41 to the optical current sensor 40, and the intensity P of the optical signal returned from the optical current sensor 40 to the signal processing circuit 41, can be derived from the above-noted equation (1) where m is the intensity modulation factor of optical current sensor 40 for an ac current signal Isinωt. The signal processing circuit 41 then extracts the (m*sinωt) component from the intensity P value derived from equation (1), and obtains the current value Isinωt( m*sinωt). While this is substantially the same as in the optical current sensor apparatus shown in FIG. 3, the method used by the optical current sensor apparatus shown in FIG. 4 to extract the (m*sinωt) component from intensity P differs as described below.

The LED driver 415 of this signal processing circuit 41 controls the drive current for driving the LED 416. It should be noted here that the LED driver 415 controls the output drive current to a predetermined constant level. The LED 416 thus outputs a light beam supplied to the optical current sensor 40 according to this applied constant drive current.

The optical-electrical conversion circuit then converts the optical signal from the optical current sensor 40 to an electrical signal. The filter 412 thus extracts the dc component Vα from the electrical signal output by the optical-electrical conversion circuit 411. The subtraction circuit 413 subtracts the dc component Vα extracted by the filter 412 from the electrical signal obtained by conversion by the optical-electrical conversion circuit 411. The divider circuit 414 then divides the remainder value passed from the subtraction circuit 413 by the dc component Vα extracted by the filter 412.

The basic operation whereby the optical current sensor apparatus shown in FIG. 4 measures current is described next below. First, when a predetermined drive current is applied in the signal processing circuit 41, the LED 416 emits a light beam. The light beam thus outputted from the signal processing circuit 41 is inputted through the optical fibers 43 to the optical current sensor 40, intensity modulated therein, and then returned again through the optical fibers 43 to the signal processing circuit 41. The optical-electrical conversion circuit: 411 of the signal processing circuit 41 then converts the returned light intensity P to a current value V. The output V from the optical-electrical conversion circuit 411 can be derived from equation (5):

$$V = kV0(1 + m*\sin\omega t) \quad (5)$$

where kV0 is a current value equivalent to αP0 when intensity P is converted to a current value.

The current value V derived from equation (5) is applied to the filter 412. The filter 412 then extracts current value Vα from current value V where Vα is the dc component shown in equation (6).

$$V\alpha = kV0 \quad (6)$$

The output V from the optical-electrical conversion circuit 411 and the output Vα from the filter 412 are thus applied to the subtraction circuit 413. The subtraction circuit 413 output and filter output Vα are then applied to the divider circuit 414, which obtains output Vout as shown in equation (7).

$$Vout = (V - V\alpha)/V\alpha \quad (7)$$
$$= m*\sin\omega t$$

It will thus be obvious that the optical current sensor apparatus shown in FIG. 4 can therefore obtain the current value Isinωt( m*sinωt) from the output Vout passed by the divider circuit 414.

As will be known from the above, each of the optical current sensor apparatuses shown in FIG. 3 and FIG. 4 can remove measurement error introduced by intensity modulation other than that induced by the current being measured, and thus achieve accurate current measurement. Conventional optical current sensor apparatuses other than those as shown in FIGS. 3 and 4 and other types of conventional intensity modulated optical sensor apparatuses such as optical voltage sensor apparatuses can also measure desired physical quantities using a signal processing circuit constructed as described above.

A problem with such conventional apparatuses, however, is that the LED is continuously driven during the measurement process. Because much power is needed to drive the LED, a supply of several hundred milliwatts must be constantly supplied to meet the overall power requirements, of which the LED drive current is but one part, of the optical sensor signal processing circuit.

Conventional optical sensor apparatuses have been primarily installed as a means of monitoring transmission line loads and detecting fault information within the context of automating the power distribution network. Long-term installation in a single location is therefore common, and maintaining a constant power supply has not been a problem. In, for example, load monitoring applications, however, it has become necessary to monitor load changes at various points. This has led to the need for a portable optical sensor apparatus that can be easily used for monitoring where monitoring is required rather than at a single fixed location. Achieving such an optical sensor apparatus, however, requires low power consumption and the ability to operate the sensor apparatus using a battery or other power supply with limited capacity.

While power consumption can be reduced by using a pulse driven LED, for example, this is not simple for the following reasons. That is, to achieve an accurate measurement by means of an optical sensor apparatus, a process for optical-electrically converting an optical signal, and extracting a dc component from the converted electrical signal., is essential. As a result, all conventional optical sensor apparatuses have a filter for dc component extraction as in the exemplary apparatuses shown in FIGS. 3 and 4. However, such filter circuits typically have a large time constant, and anywhere from several seconds to several ten seconds is required for the filter to stabilize after a signal is input. Such conventional optical sensor apparatuses therefore cannot pulse drive the LED because the LED must be driven constantly so that the dc component extraction operation can be sustained continuously.

SUMMARY OF THE INVENTION

An object of the present invention is therefore to provide an optical sensor apparatus whereby accurate measurements can be made without using a filter circuit and as a result whereby power consumption can be reduced by, for example, being able to pulse drive an LED.

The present invention has the following characteristics in order to solve the above problem.

A first aspect of the present invention is directed to an optical sensor apparatus for optically determining and measuring a change in a physical quantity to be measured, comprising:

an optical sensor for intensity modulating supplied light according to the change in the physical quantity to be measured; and a signal processing circuit for supplying light to the optical sensor and processing an intensity-modulated optical signal obtained from the optical sensor to obtain a measured value of the physical quantity;

the signal processing circuit comprising:

light emitting means for outputting light supplied to the optical sensor;

measuring means for processing an optical signal outputted from the optical sensor to measure the physical quantity; and control means for controlling the light emitting means;

wherein the control means, during an initialization mode in which the optical sensor is not sensing the physical quantity, supplies dc light of a predetermined intensity from the light emitting means to the optical sensor, and adjusts the intensity of the dc light so that an intensity of an optical signal inputted to the measuring means is a predetermined value, and during a measurement mode in which the optical sensor senses the physical quantity, supplies pulse light of the intensity adjusted in the initialization mode from the light emitting means to the optical sensor; and wherein the measuring means electrically processes the optical signal outputted from the optical sensor to measure the physical quantity when the pulse light is supplied from the light emitting means to the optical sensor.

As described above, in the first aspect, the signal processing circuit thus supplies dc light of a predetermined intensity to the optical sensor when the optical sensor is not detecting the physical quantity to be measured, and adjusts the intensity of the supplied light so that the intensity of the optical light returned to the signal processing circuit is equal to a predetermined value. Note that dc light as used herein refers to the light outputted by a light-emitting diode, for example, driven by a dc current. When the optical sensor is detecting the physical quantity, the signal processing circuit then electrically processes the optical signal outputted from the optical sensor to measure the physical quantity. Unlike a conventional optical sensor apparatus, the optical sensor apparatus according to the present invention can thus accurately measure a physical quantity without using a filter. In addition, because a filter can thus be eliminated, a pulse light can be supplied to the optical sensor when the optical sensor is detecting a physical quantity. As a result, it is possible to accurately measure the current value which varies in time with reduced power consumption.

According to a second aspect, in the first aspect, the measuring means comprises:

optical-electrical conversion means for optical-electrically converting the intensity-modulated optical signal from the optical sensor;

analog/digital conversion means for analog/digitally converting an electrical signal outputted by conversion by the optical-electrical conversion means; and processing means for calculating a measured value of the physical quantity based on a digital signal obtained by conversion by the analog/digital conversion means.

As described above, in the second aspect, a measurement process suited to pulse light can therefore be used because the optical signal from the optical sensor is first optical-electrically converted, then A/D converted, and a measure of the physical quantity is then calculated using the resulting digital signal.

According to a third aspect, in the second aspect, when the pulse light is supplied from the light emitting means to the optical sensor, and during each period when an intensity of the pulse light is low, the processing means runs in an energy-saving mode in which a processor rate is relatively slow.

As described above, in the third aspect, power consumption can be further reduced in the optical sensor apparatus because the processing means runs in a normal mode in which the processor rate is relatively fast when the measurement is executed, and operates in an energy-saving mode in which the processor rate is relatively slow when measurement stops.

According to a fourth aspect, in the second aspect, during the measurement mode, the control means further starts and stops operation of the optical-electrical conversion means and the analog/digital conversion means synchronized to a process supplying the pulse light.

As described above, in the fourth aspect:, power consumption can be yet further reduced by thus operating the optical-electrical conversion means and the analog/digital conversion means in a pulse fashion.

According to a fifth aspect, in the fourth aspect, when the pulse light is supplied from the light emitting means to the optical sensor, and during each period when the intensity of the pulse light is low, the processing means runs in the energy-saving mode in which the processor rate is relatively slow.

As described above, in the fifth aspect, power consumption can be further reduced in the optical sensor apparatus because the processing means runs in a normal mode in which the processor rate is relatively fast when the measurement is executed, and operates in an energy-saving mode in which the processor rate is relatively slow when measurement stops.

According to a sixth aspect, in the first aspect, the control means operates in the initialization mode only once, when the optical sensor is not sensing the physical quantity before measurement begins.

As described above, in the sixth aspect, by performing the auto-power control operation only once before measurement begins, power consumed by repeated APC operation can be saved.

A seventh aspect of the present invention is directed to a signal processing circuit used in an optical sensor apparatus for optically determining and measuring a change in a physical quantity to be measured, the optical sensor apparatus having an optical sensor for intensity modulating supplied light according to the change in the physical quantity to be measured, and the signal processing circuit comprising:

light emitting means for outputting light supplied to the optical sensor;

measuring means for processing an optical signal outputted from the optical sensor to measure the physical quantity, and control means for controlling the light emitting means;

wherein the control means, during an initialization mode in which the optical sensor is not sensing the physical quantity, supplies dc light of a predetermined intensity from the light emitting means to the optical sensor, and adjusts the intensity of the dc light so that an intensity of an optical signal inputted to the measuring means is a predetermined value, and during a measurement mode in which the optical sensor senses the physical quantity, supplies pulse light of the intensity adjusted in the initialization mode from the light emitting means to the optical sensor; and wherein the measuring means electrically processes the optical signal outputted from the optical sensor to measure the physical quantity when the pulse light is supplied from the light emitting means to the optical sensor.

These and other objects, features, aspects, and advantages of the present invention will become more apparent from the following detailed description of the present invention when taken in conjunction the accompanying drawings.

DESCRIPTION OF THE PREFERRED EMBODIMENTS

Figure 1:
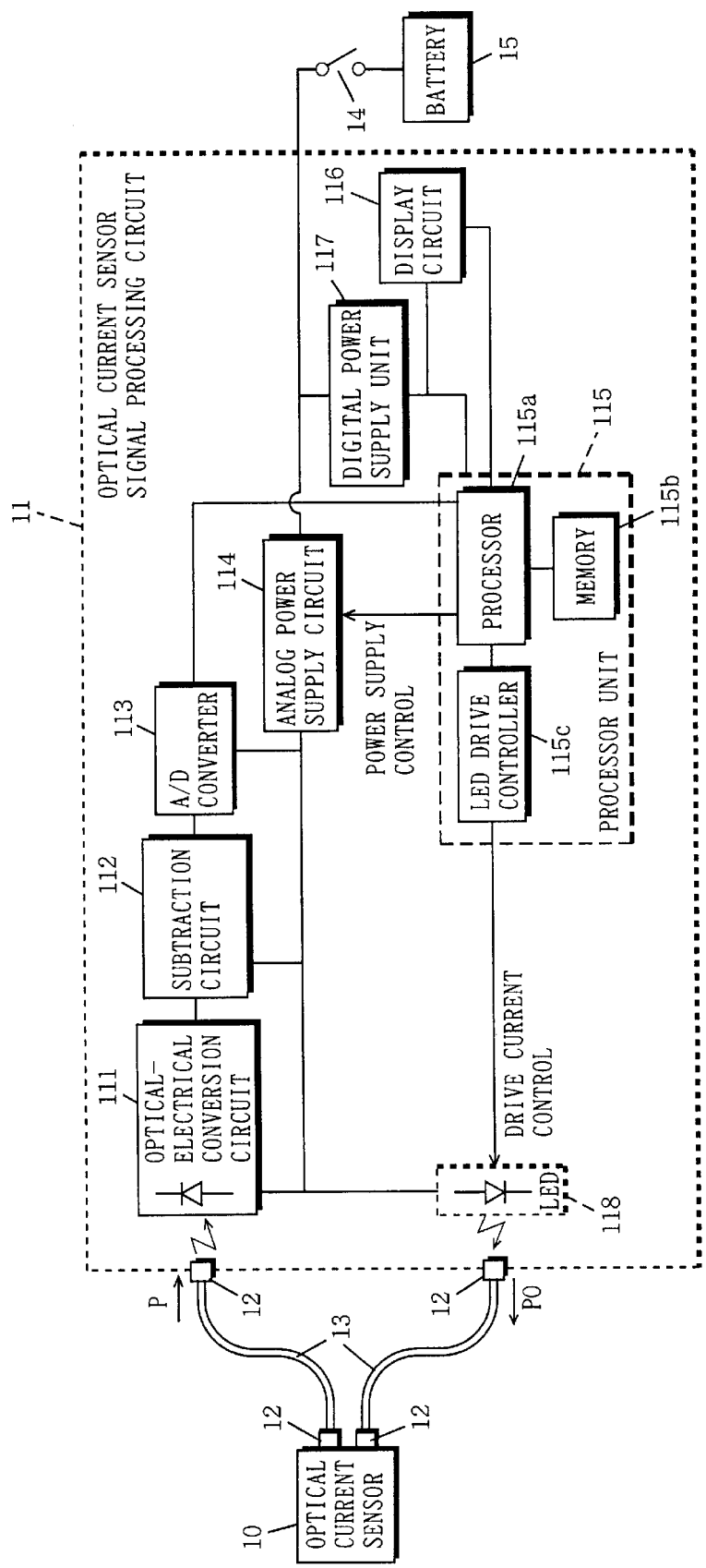
FIG. 1 is a block diagram of the structure of an optical current sensor apparatus according to a preferred embodiment of the present invention.

An optical sensor apparatus according to a preferred embodiment of the present invention is described below with reference to the accompanying figures. FIG. 1 is a block diagram of the structure of an optical current sensor apparatus exemplary of the present invention. As shown in FIG. 1, an optical current sensor apparatus according to this preferred embodiment comprises an optical current sensor 10, an optical current sensor signal processing circuit 11, a power supply switch 14, and a battery 15. The optical current sensor 10 and optical current sensor signal processing circuit 11 (simply signal processing circuit 11 below) are connected by means of optical fibers 13 and optical connectors 12. The signal processing circuit 11 and battery 15 are connected and isolated by means of the power supply switch 14. It should be noted that an optical current sensor apparatus of FIG. 1 is used, for example, to measure current flow through a power transmission line at any desired point along the line. To accomplish this, the optical current sensor 10 is typically disposed at one end of a one to two meter long pole, and the signal processing circuit 11, power supply switch 14, and battery 15 are disposed at appropriate positions between the optical current sensor 10 and the other end of the pole. Current measurements are taken by an operator holding the end of the pole opposite the optical current sensor 10 so as to bring the optical current sensor 10 close enough to the transmission line.

The signal processing circuit 11 comprises an optical-electrical conversion circuit 111, subtraction circuit 112, analog/digital (A/D) converter 113, analog power supply circuit 114, processor unit 115, display circuit 116, digital power supply circuit 117, and LED 118. The processor unit 115 further comprises a processor 115a, memory 115b, and LED drive controller 115c.

The optical current sensor 10 contains a magneto-optical crystal (not shown in the figure), detects a change in (the field strength of) the current to be measured, and intensity modulates light. More specifically, a polarization plane in the magneto-optical crystal rotates according to a current-induced change in the magnetic field, and the transmitted light quantity changes. The optical current sensor 10 uses this property of the magneto-optical crystal to convert a change in current to a change in light intensity. The signal processing circuit 11 supplies light (dc light) to the optical current sensor 10, and calculates a current value based on the optical signal obtained by modulation by the optical current sensor 10.

The relationship between the intensity P0 of light output from the signal processing circuit 11 to the optical current sensor 10, and the intensity P of the optical signal returned from the optical current sensor 10 to the signal processing circuit 11, can be derived from the above-noted equation (1) where m is the intensity modulation factor of optical current sensor 10 for an ac current signal $I\sin\omega t$. The signal processing circuit 11 then extracts only the ($m*\sin\omega t$) component from the intensity P value derived from equation (1), and obtains the current value $I\sin\omega t(\ m*\sin\omega t)$.

The LED 118 of the signal processing circuit 11 emits the light (dc light) supplied to the optical current sensor 10 according to a drive current applied to the LED 118.

The optical-electrical conversion circuit 111 converts the optical signal returned from the optical current sensor 10 to an electrical signal, and the subtraction circuit 112 subtracts a predetermined value K from the electrical signal obtained by conversion by the optical-electrical conversion circuit 111. The A/D converter 113 A/D converts the analog value supplied from the subtraction circuit 112. The analog power supply circuit 114 supplies current to the LED 118, optical-electrical conversion circuit 111, subtraction circuit 112, and A/D converter 113. Note that these components are collectively referred to below as the analog section of the signal processing circuit 11.

The processor unit 115 adjusts the drive current supplied to the LED 118 according to the digital data obtained by A/D conversion by the A/D converter 113. The processor unit 115 also controls supply operation of the analog power supply circuit 114. Within the processor unit 115, the processor 115a performs the above-noted drive current adjustment operation, and the memory 115b stores data required for processor 115a operation, including values generated during and used in processor 115a operation. The LED drive controller 115c controls the drive current (dc current) for driving the LED 118. This drive current control is a process for effecting a time-base change in the current value, for example, holding the current to a continuous constant value (during an initialization mode) and pulse changing the current value (during a measurement mode).

The display circuit 116 presents the results outputted by the processor 115a and the like. The digital power supply circuit 117 supplies current to the processor unit 115 and display circuit 116 (collectively referred to below as the digital section of the signal processing circuit 11).

Figure 2:
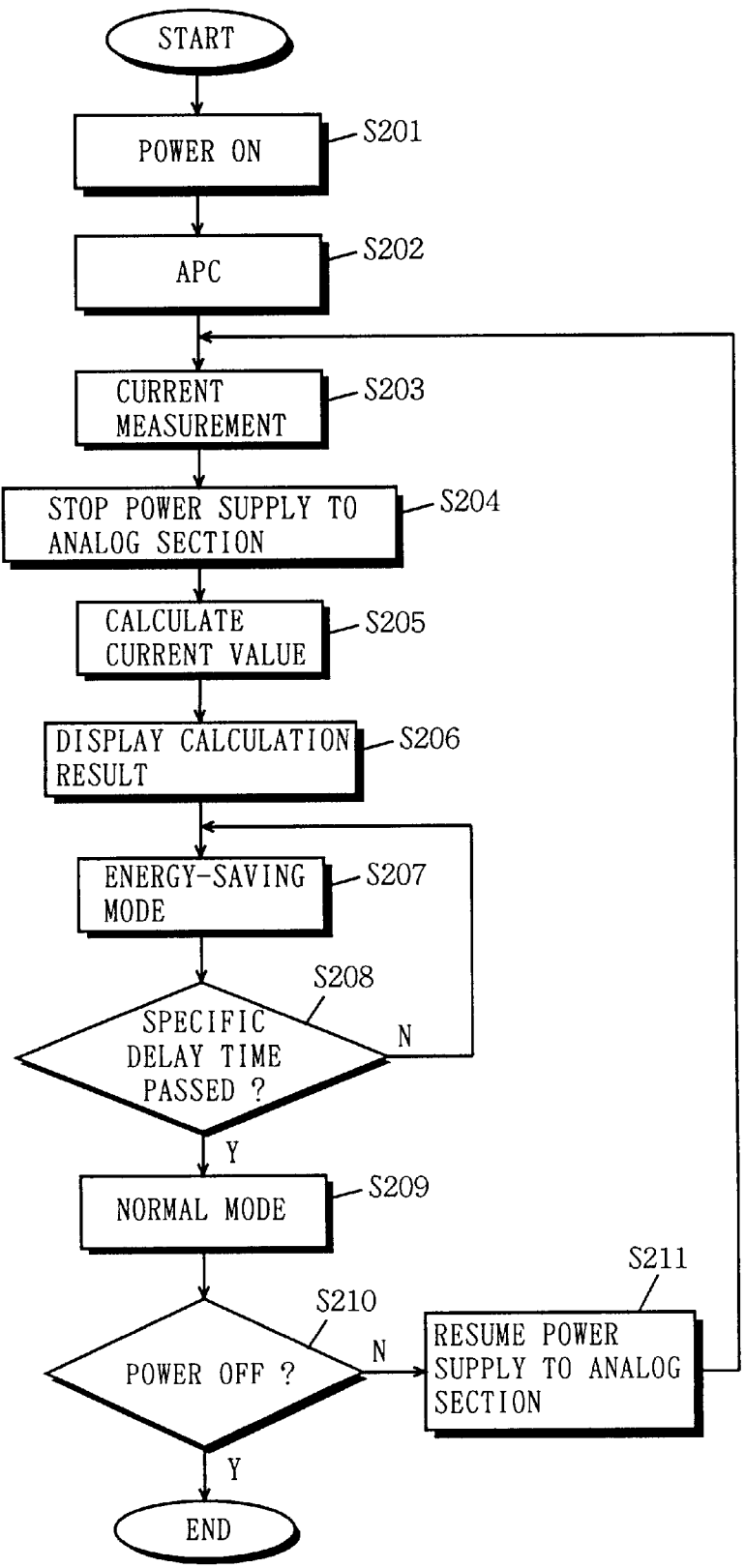
FIG. 2 is a flow chart used to describe an operation of the optical current sensor apparatus shown in FIG. 1 for measuring an electric current.

FIG. 2 is a flow chart showing an operation of the apparatus shown in FIG. 1 for measuring an electric current. Described below is the operation of the apparatus shown in FIG. 1 for measuring an electric current using FIG. 2. Note that it is here assumed that an operator is attempting to measure current flowing through a transmission line, not shown in the figures. With the optical current sensor 10 held an appropriate distance from the transmission line, the operator then turns the power supply switch 14 on. In response, power is supplied from the battery 15 (step S201). When power supply begins, the apparatus shown in FIG. 1 performs an Auto Power Control (APC) operation (step S202). This APC operation in step S202 is described in further detail below.

In step S202, the LED drive controller 115c is in the initialization mode at the start of operation. First, when a continuous predetermined drive current (dc current) is supplied to the LED 118 under the control of the LED drive controller 115c, light (dc light) is, in response, outputted from the LED 118. Once the APC operation is completed and the LED drive controller 115c is switched to the measurement mode in step S203, the LED drive controller 115c supplies the APC-adjusted drive current obtained as a result of the APC step (step S202) to the LED 118 in pulses, and the LED 118 thus pulse emits light.

Light thus emitted from the signal processing circuit 11 at intensity P0 travels through optical fibers 13 to the optical current sensor 10, and light of intensity P later travels back through optical fibers 13 to the signal processing circuit 11. Because the optical current sensor 10 is still separated an appropriate distance from the transmission line at this time, the light of intensity P is not intensity modulated. The relationship between P and P0 can thus be derived from equation (8):

$$P = \alpha P0 \tag{8}$$

where $\alpha$ is a coefficient corresponding to the optical transmission loss of, for example, the optical current sensor 10, optical connectors 12, and optical fibers 13.

In other words, the electrical signal obtained by optical-electrical conversion of the returned light contains only a dc component. As a result, the dc component can be obtained by simply measuring the current value without a filter which is conventionally required.

The optical-electrical conversion circuit 111 of the signal processing circuit 11 converts intensity P of the returned light, and the subtraction circuit 112 subtracts a predetermined value K from the resulting analog current value. The A/D converter 113 then A/D converts the resulting analog value obtained by subtraction by a sampling process, and applies the resulting digital data to the processor unit 115. In the processor unit 115, based on the supplied digital data, the processor 115a calculates a drive current that will result in the analog current value output by the subtraction circuit 112 being zero. The calculated result is then stored to memory 115b and applied to the LED drive controller 115c.

Based on this calculated value, the LED drive controller 115c adjusts the drive current applied to the LED 118. As a result, when the optical current sensor 10 is moved into proximity with the transmission line and current measurement begins, measurement error resulting from intensity modulation other than the current-induced intensity modulation is corrected, and accurate measurement can be made as described further below. This completes the APC operation of step S202. Note that in the exemplary optical current sensor apparatus shown in FIG. 1, APC is not repeated until the power is again turned on.

It should be further noted here that the magnitude of intensity modulation other than that induced by the current being measured varies gradually over extended continuous use as a result of stress aging of the optical fibers 13 and other parts of the transmission path, and aging of photodiodes contained in the LED 118 and optical-electrical conversion circuit 111. This makes continuous APC operation necessary in conventional equipment that are fixed in position to a transmission line and continuously measure current over an extended period of time. A portable optical current sensor apparatus exemplary of the present invention, however, is typically used continuously for only a period of several hours, and changes such as described above are substantially nonexistent in such a short period of time. Sufficiently accurate current measurement is; therefore possible with the APC operation performed only once immediately after the power supply switch 14 is turned on.

When the APC operation of step S202 is finished, a notification to that effect is presented by the display circuit 116. When the operator observes this notification and then moves the optical current sensor 10 into proximity with the transmission line, the apparatus of FIG. 1 starts current measurement (step S203). This current measurement process of step S203 is described in detail below.

After current measurement begins, the light returned to the signal processing circuit 11 has been intensity modulated by the optical current sensor 10.

In the signal processing circuit 11, the optical-electrical conversion circuit 111 thus optical-electrically converts intensity P of the returned light, and the subtraction circuit 112 subtracts a predetermined value (K) from the analog current value obtained by conversion by the optical-electrical conversion circuit 111. As a result of the APC operation completed in step S202, the resulting analog current value difference contains only an ac component equivalent to the intensity modulation applied by the optical current sensor 10. The A/D converter 113 then samples the analog current value for A/D conversion, and applies the resulting digital data to the processor unit 115 to complete the measurement step S203.

When digital data is applied to the processor unit 115, the processor 115a first instructs the analog power supply circuit 114 to stop the power supply to the above-noted analog section (LED 118, optical-electrical conversion circuit 111, subtraction circuit 112, A/D converter 113) (step S204), and then calculates the current value based on the digital data (step S205). The result is then presented by the display circuit 116.

Figure 3:
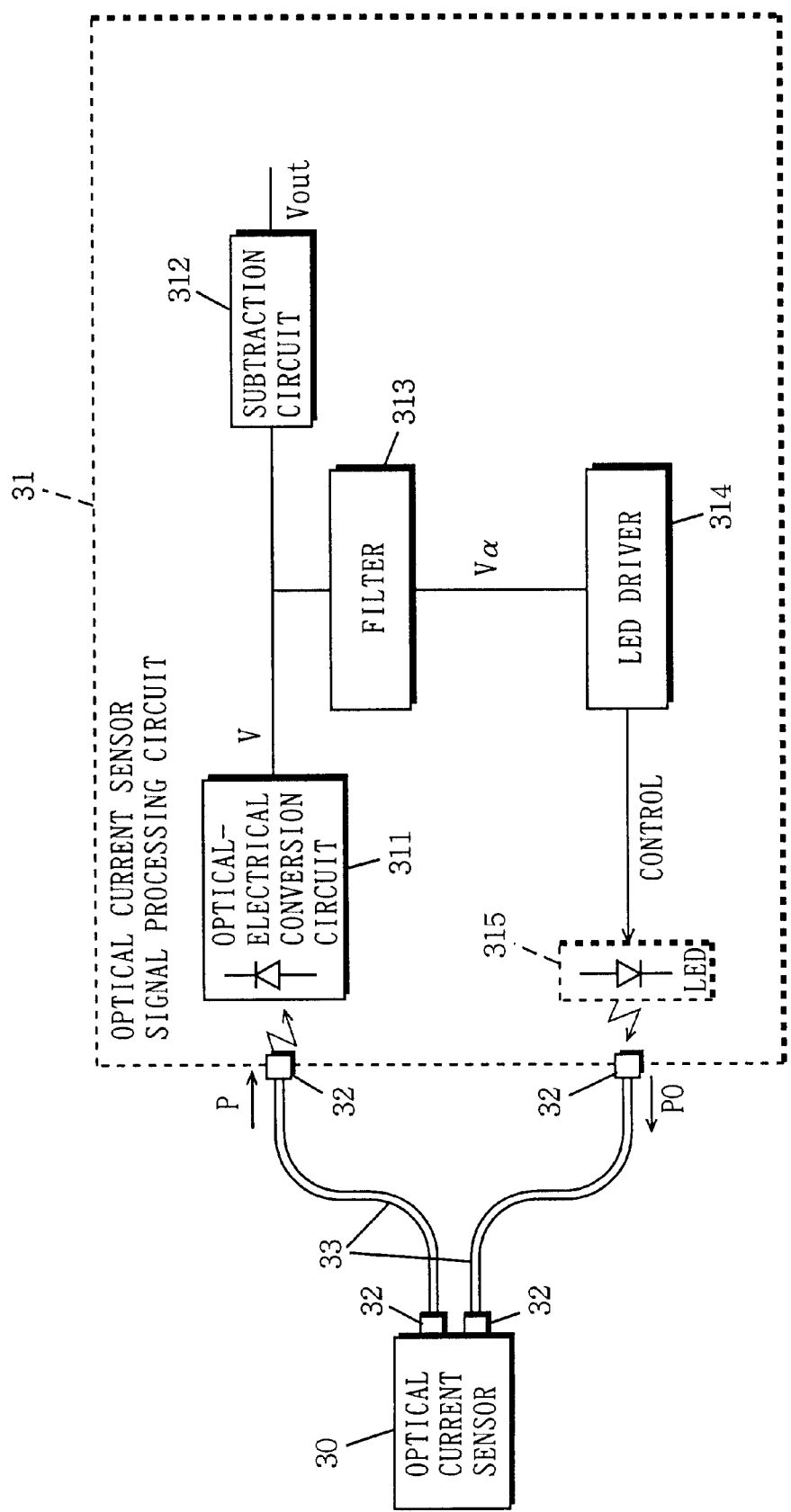
FIG. 3 is a block diagram of an optical current sensor apparatus exemplary of the related art.
Figure 4:
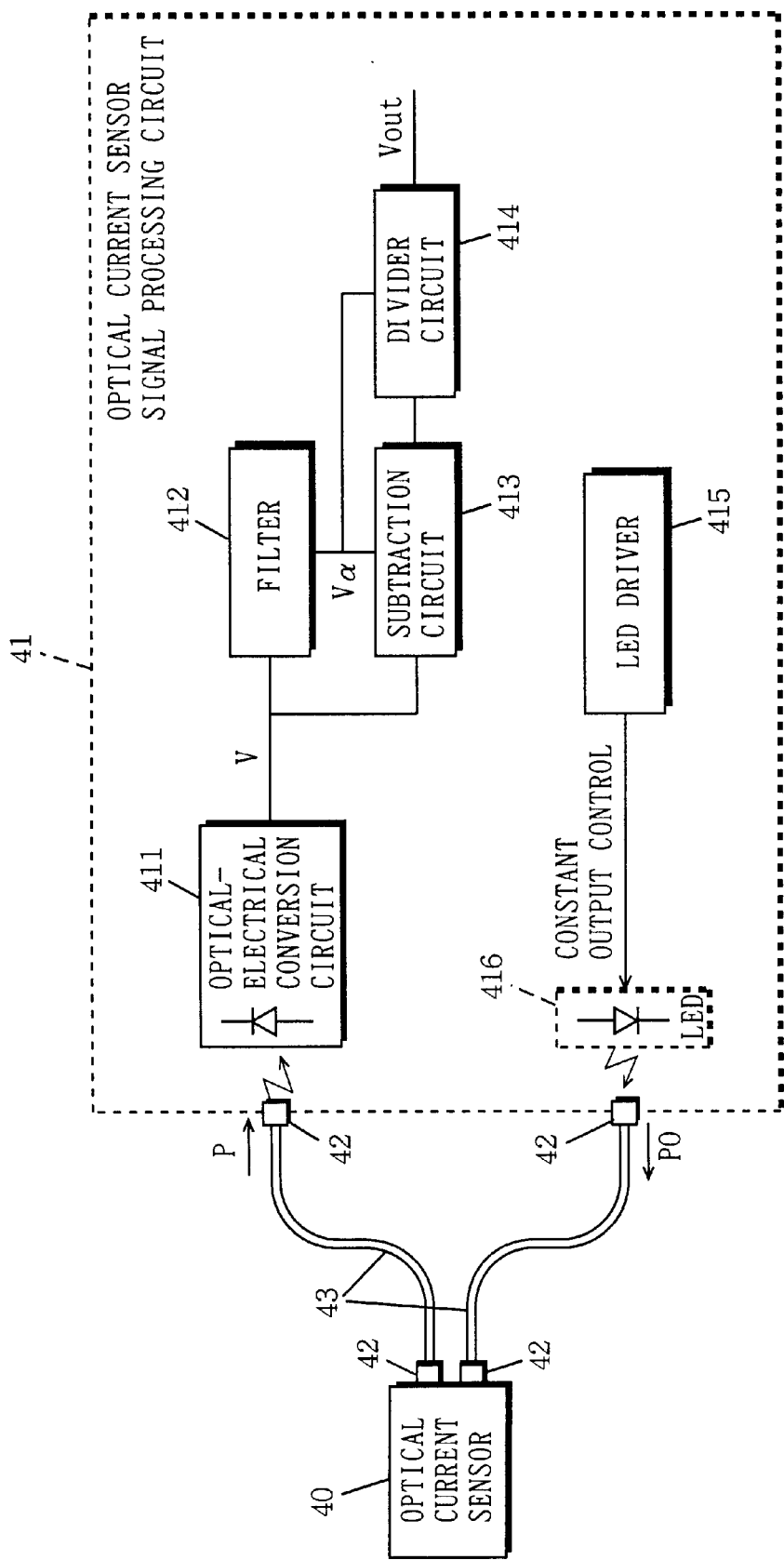
FIG. 4 is a block diagram of another optical current sensor apparatus exemplary of the related art.

As will be known from the above description, the signal processing circuit 11 of the optical current sensor apparatus shown in FIG. 1 continuously supplies dc light of a predetermined intensity to the optical current sensor 10 when the optical current sensor 10 is not detecting the current to be measured, and adjusts the intensity of the dc light supply so that the intensity of the optical signal returned to the signal processing circuit 11 is equal to a predetermined value. When the optical current sensor 10 then detects current, the optical signal outputted from the optical current sensor 10 can be electrically processed and the current value measured. Unlike the optical current sensor apparatuses shown in FIGS. 3 and 4, the optical current sensor apparatus shown in FIG. 1 can obtain accurate measurements without using a filter circuit.

As will also be known from the above description, the optical current sensor apparatus shown in FIG. 1 optical-electrically converts an optical signal from the optical current sensor 10, A/D converts the resulting electrical signal, and then calculates the measured current value based on the obtained digital signal. As a result, the optical current sensor apparatus of this preferred embodiment can perform a process suited to measuring pulse light as described further below.

It should also be noted that power consumption is reduced in the apparatus shown in FIG. 1 by stopping the supply of power to the analog section and, particularly, the LED 118, after measurement is completed.

As noted above, the optical current sensor apparatus shown in FIG. 1 can use a pulse-like measurement method as described below because it does not comprise a filter circuit with a large time constant. More specifically, when displaying the result begins in step S206, the processor 115a switches to an energy-saving mode (step S207). In this energy-saving mode, the processor 115a runs at a slower speed than during the normal mode used before the energy-saving mode, and power consumption is thus reduced. The result display is sustained until the processor unit 115 sends a new display command to the display circuit 116.

The processor 115a next determines whether a specific time (1 second, for example) has passed since the energy-saving mode was entered (step S208). When this time has passed, the normal mode is entered (step S209). The processor 115a then determines whether the power supply switch 14 has been turned off (step S210). If not, the analog power supply circuit 114 is instructed to resume power supply to the analog section (step S211), and control then loops back to step S203 to repeat the above measurement process. However, if the power supply switch 14 is turned off, the procedure ends. This pulse mode measurement process thus refers to the above-described method of measuring, pausing, and then measuring again in a repeated loop.

It should be further noted that when the measurement process in step S203 is repeated, the LED drive controller 115c controls the drive current value applied to the LED 118 so that it is equal to the value stored in the memory 115b.

By thus using a pulse-like measurement method, the apparatus shown in FIG. 1 can with minimal power consumption accurately measure a current value that varies over time. As a result, the apparatus can use a low capacity battery 15 for the power supply. It should also be noted that while this preferred apparatus uses a pulse mode measurement process based on the pulse light emitted on an approximately one second cycle, its functionality as measurement equipment is in no way impaired compared with continuously operating measurement equipment. This is because at least several seconds are typically required for a measured value to be displayed and read ba the operator after the optical current sensor 10 senses a magnetic field.

While the present invention has been described above with reference to an optical current sensor apparatus comprising an optical current sensor 10 as shown in FIG. 1, the present invention shall not be so limited and can be applied to an optical voltage sensor apparatus comprising an optical voltage sensor. Moreover, the present invention can also be applied to other types of optical sensor apparatuses comprising an optical sensor for intensity modulating light according to a change in et physical quantity. Whatever the type of optical sensor apparatus, a signal processing circuit functionally comparable to the optical current sensor signal processing circuit 11 can also be achieved.

It will also be obvious that while the LED 118 is used for outputting light supplied to the optical current sensor 10 in the apparatus shown in FIG. 1, a laser diode or other type of light emitting element can be alternatively used.

Furthermore, while the APC and measurement operations are performed by the same processing system in the above-described preferred embodiment, it will also be obvious that these can be separated into discrete systems for APC and measurement, respectively.

In the APC operation (step S202) of the above preferred embodiment of the invention, a constant value (K) is subtracted from the ac analog signal by the subtraction circuit 112, and the drive current value of the LED 118 is then adjusted so that the resulting analog current value difference is zero, as a means of increasing the dynamic range of the ac analog signal. It will also be obvious, however, that it is alternatively possible to eliminate the subtraction circuit 112, and adjust the drive current value of the LED 118 so that the output from the optical-electrical conversion circuit 111 is equal to a predetermined analog current value.

As will also be known from the above, the APC operation is performed automatically only once immediately after the power supply switch 14 is turned on in this preferred embodiment. It will also be obvious, however, that a reset switch can be further disposed to the optical current sensor signal processing circuit 11 so that the operator can manually implement the APC operation at any desired time when the optical current sensor 10 is not sensing a magnetic field.

It will also be known from the above that the measurement operation is performed in pulses at a regular period after the APC operation in according to this preferred embodiment. It is also possible, however, for the optical current sensor signal processing circuit 11 to further comprise a measurement switch. In this case, the optical current sensor apparatus can be designed so that the processor 115a enters the normal mode and power supply to the analog section begins only when the operator presses the measurement switch after the power supply switch 14 is turned on, the APC operation is completed, power supply to the analog section has stopped, and the processor 115a is in the energy-saving mode. Power consumption is further reduced in this case because a measurement is only taken when the operator presses the measurement switch.

As will also be known from the above, the processor unit 115 controls the analog power supply circuit 114 to start and stop power supply to the analog section in this preferred embodiment. It will also be obvious, however, that the invention can be designed with an energy-saving mode built in to the analog section itself, and the processor unit 115 directly controlling the operating mode of the analog section. This can be accomplished, for example, by the LED drive controller 115c controlling the drive current value to zero in order to stop the LED 118 from emitting, and then controlling the drive current value to the value stored in the memory 115b in order to make the LED 118 emit.

Furthermore, while the above preferred embodiment of the invention has been described using the battery 15 for the power supply, the same energy saving effect noted above can be achieved whether a larger capacity battery, an AC power source, or other type of power source is used.

While the invention has been described in detail, the foregoing description is in all aspects illustrative and not restrictive. It is understood that numerous other modifications and variations can be devised without departing from the scope of the invention.

What is claimed is:

1. An optical sensor apparatus for optically determining and measuring a change in a physical quantity to be measured, comprising:

an optical sensor for intensity modulating supplied light according to the change in the physical quantity to be measured; and a signal processing circuit for supplying light to said optical sensor and processing an intensity-modulated optical signal obtained from said optical sensor to obtain a measured value of said physical quantity;

said signal processing circuit comprising:

light emitting means for outputting light supplied to said optical sensor;

measuring means for processing an optical signal outputted from said optical sensor to measure said physical quantity; and control means for controlling said light emitting means;

wherein said control means, during an initialization mode in which said optical sensor is not sensing said physical quantity, supplies dc light of a predetermined intensity from said light emitting means to said optical sensor, and adjusts the intensity of the dc light so that an intensity of an optical signal inputted to said measuring means is a predetermined value, and during a measurement mode in which said optical sensor senses said physical quantity, supplies pulse light of the intensity adjusted in said initialization mode from said light emitting means to said optical sensor; and wherein said measuring means electrically processes the optical signal outputted from the optical sensor to measure said physical quantity when said pulse light is supplied from said light emitting means to said optical sensor.

2. The optical sensor apparatus as set forth in claim 1, wherein said measuring means comprises:

optical-electrical conversion means for optical-electrically converting the intensity-modulated optical signal from said optical sensor;

analog/digital conversion means for analog/digitally converting an electrical signal outputted by conversion by said optical-electrical conversion means; and processing means for calculating a measured value of said physical quantity based on a digital signal obtained by conversion by said analog/digital conversion means.

3. The optical sensor apparatus as set forth in claim 2, wherein when said pulse light is supplied from said light emitting means to said optical sensor, and during each period when an intensity of the pulse light is low, said processing means runs in an energy-saving mode in which a processor rate is relatively slow.

4. The optical sensor apparatus as set forth in claim 2, wherein during said measurement mode, said control means further starts and stops operation of said optical-electrical conversion means and said analog/digital conversion means synchronized to a process supplying said pulse light.

5. The optical sensor apparatus as set forth in claim 4, wherein when said pulse light is supplied from said light emitting means to said optical sensor, and during each period when the intensity of the pulse light is low, said processing means runs in the energy-saving mode in which the processor rate is relatively slow.

6. The optical sensor apparatus as set forth in claim 1, wherein said control means operates in said initialization mode only once, when said optical sensor is not sensing said physical quantity before measurement begins.

7. A signal processing circuit used in an optical sensor apparatus for optically determining and measuring a change in a physical quantity to be measured, said optical sensor apparatus having an optical sensor for intensity modulating supplied light according to the change in the physical quantity to be measured, and the signal processing circuit comprising:

light emitting means for outputting light supplied to said optical sensor;

measuring means for processing an optical signal outputted from said optical sensor to measure said physical quantity, and control means for controlling said light emitting means;

wherein said control means, during an initialization mode in which said optical sensor is not sensing said physical quantity, supplies dc light of a predetermined intensity from said light emitting means to said optical sensor, and adjusts the intensity of the dc light so that an intensity of an optical signal inputted to said measuring means is a predetermined value, and during a measurement mode in which said optical sensor senses said physical quantity, supplies pulse light of the intensity adjusted in said initialization modes from said light emitting means to said optical sensor; and wherein said measuring means electrically processes the optical signal outputted from the optical sensor to measure said physical quantity when said pulse light is supplied from said light emitting means to said optical sensor.

* * * * *